(12) United States Patent
Uhlenbrock et al.

(10) Patent No.: US 6,214,729 B1
(45) Date of Patent: Apr. 10, 2001

(54) METAL COMPLEXES WITH CHELATING C-, N-DONOR LIGANDS FOR FORMING METAL-CONTAINING FILMS

(75) Inventors: Stefan Uhlenbrock, Boise; Brian A. Vaartstra, Nampa, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/144,912

(22) Filed: Sep. 1, 1998

(51) Int. Cl.[7] ................................................. C23C 16/18
(52) U.S. Cl. ........................ 438/681; 427/250; 427/252; 427/253; 427/249.17; 427/255.29; 427/255.393; 438/683; 438/685; 438/686
(58) Field of Search ............................... 427/248.1, 250, 427/252, 253, 249.17, 255.29, 255.38, 255.393; 438/681, 683, 685, 686

(56) References Cited

U.S. PATENT DOCUMENTS

| | | |
|---|---|---|
| 5,015,747 | 5/1991 | Hostalek et al. . |
| 5,036,022 | 7/1991 | Kuech et al. . |
| 5,084,128 | 1/1992 | Baker . |
| 5,112,432 * | 5/1992 | Erdmann et al. ............... 427/252 |
| 5,180,687 | 1/1993 | Mikoshiba et al. . |
| 5,259,915 | 11/1993 | Pohl et al. . |
| 5,451,260 * | 9/1995 | Versteeg et al. ............... 118/725 |
| 5,545,591 | 8/1996 | Sugai et al. . |
| 5,607,722 | 3/1997 | Vaartstra et al. . |
| 5,659,057 | 8/1997 | Vaartstra . |
| 5,863,836 | 1/1999 | Jones . |
| 5,924,012 | 7/1999 | Vaartstra . |

FOREIGN PATENT DOCUMENTS

| | | | |
|---|---|---|---|
| 295 876 | 11/1991 | (DE) | ............... C23C/14/32 |
| 4213292 * | 10/1993 | (DE) . | |
| 4213292 A1 | 10/1993 | (DE) . | |
| 43 13 292 A1 | 10/1993 | (DE) . | |

OTHER PUBLICATIONS

Scherer et al., Chem. Vap. Dep., vol. 3, No. 1, pp. 33–35, (Feb. 25, 1997).*

M. Hostalek et al., "Novel Organometallic Starting Materials for Group III–V Semiconductor Metal–Organic Chemical Vapour Deposition", *Thin Solid Films,* 174, 1–4 (1989). (No Month).

W. Leung, et al., "Synthesis and structural characterisation of mono–and bi–nuclear cobalt(II) alklys," *J. Chem. Soc. Dalton Trans.,* 779–783 (1997). (No Month).

M. Scherer, et al., "Amine–Stabilized Cyclopentadienyl Diisobutyl Aluminum Complexes as New Kinds of Precursors for the Deposition of Thin Aluminum Films by CVD," *Chem. Vap. Deposition,* 3, 33–35 (Feb. 25, 1997).

H. Schumann et al., "Intramolecularly Stabilized Organoaluminium, –gallium and –indium Derivatives/Crystal Structures of {o–[(Dimethylamino)methyl]phenyl}dimethylgallium and {o–[(Diethylamino)methyl]phenyl}dimethylindium",*Chem. Ber.,* 123, 2093–2099 (1990). (No Month).

P. Singer, "Filling Contacts and Vias: A Progress Report", *Semiconductor Int'l,* 89–90, 92, 94 (1996), (No Month).

Versteeg et al., "Metalorganic Chemical Vapor Deposition By Pulsed Liquid Injection Using An Ultrasonic Nozzle: Titanium Dioxide on Sapphire from Titanium (IV) Isopropoxide", *J. Amer. Cer. Soc.,* 78, 2763–2768 (1995). (No Month).

* cited by examiner

*Primary Examiner*—Timothy Meeks
(74) *Attorney, Agent, or Firm*—Mueting, Raasch & Gebhardt, P.A.

(57) ABSTRACT

A method of forming a film on a substrate using transition metal or lanthanide complexes. The complexes and methods are particularly suitable for the preparation of semiconductor structures using chemical vapor deposition techniques and systems.

26 Claims, 3 Drawing Sheets

METAL COMPLEXES WITH CHELATING C-, N-DONOR LIGANDS FOR FORMING METAL-CONTAINING FILMS

FIELD OF THE INVENTION

This invention relates to methods and complexes for forming metal-containing films, such as metal or metal alloy films, particularly during the manufacture of semiconductor device structures. The complexes include a transition metal, particularly a Group VIIIB metal, and are particularly suitable for use in a chemical vapor deposition system.

BACKGROUND OF THE INVENTION

The future of microelectronic devices will depend on new designs and new materials having superior properties. Metals like cobalt, and compounds like cobalt silicide, are useful candidates for use in memory devices. Cobalt silicide ($CoSi_2$) shows advantages over the currently used tungsten silicide ($WSi_2$) due to its lower polycrystalline film resistivity (about 15 $\mu\Omega$-cm for $CoSi_2$ compared to about 70 $\mu\Omega$-cm for $WSi_2$). Furthermore, $CoSi_2$ shows good thermal and chemical stability.

In some applications, metal films are deposited using sputtering techniques; however, sputtered metal is not typically effective at filling contacts or vias because of shoulders or overhangs that form at the contact openings. These overhangs can lead to the formation of keyhole-shaped voids. Various collimation techniques help reduce this problem, but typically not enough to enable complete filling of very small geometries (e.g., less than about 0.5 $\mu$m). Therefore, it is desirable to use chemical vapor deposition (CVD) to form metal and metal alloy films.

The desirability of CVD processes depend on the availability of suitable precursor complexes. Many precursor complexes are unsuitable because of their toxicity, pyrophoricity, poor volatility, and thermal instability. Thus, there is a continuing need for methods and precursor complexes for the deposition of metal films (including metal alloy films), on semiconductor structures, particularly using vapor deposition processes.

SUMMARY OF THE INVENTION

The present invention provides complexes and methods for forming metal-containing films, particularly transition metals (i.e., Groups IB through VIIIB, also referred to as Groups 3–12), on substrates, such as semiconductor substrates or substrate assemblies during the manufacture of semiconductor structures. The methods involve forming a metal-containing film using a transition metal complex. The metal-containing film can be used in various metallization layers, particularly in multilevel interconnects, in integrated circuit structures.

The metal-containing film can include a single transition metal, or a metal alloy containing a mixture of transition metals, or a transition metal and one or more metals or metalloids from other groups in the Periodic Chart, such as Si, Ge, Sn, Pb, Bi, etc. Furthermore, for certain preferred embodiments, the metal-containing film can be a carbide, nitride, phosphide, arsenide, stibnide, sulfide, selenide, telluride, or combinations thereof.

Thus, in the context of the present invention, the term "metal-containing film" includes, for example, relatively pure films of cobalt, rhodium, iridium, nickel, palladium, platinum, iron, ruthenium, and osmium, for example, alloys of these metals (or other transition metals) with or without other metals or metalloids (e.g., Si), or mixtures thereof. The term also includes complexes of metals or metal alloys with other elements (e.g., C, N, P, As, Sb, S, Se, and Te). The terms "single transition metal film" or "single metal film" refer to relatively pure films of single transition metals, for example. The terms "transition metal alloy film" or "metal alloy film" refer to films of the transition metals in alloys with or without other metals or metalloids, for example. That is, if there are no metals or metalloids from groups in the Periodic Chart other than transition metals, the alloy films contain combinations of the transition metals.

One preferred method of the present invention involves forming a film on a substrate, such as a semiconductor substrate or substrate assembly during the manufacture of a semiconductor structure, by: providing a substrate (preferably, a semiconductor substrate or substrate assembly); providing a precursor composition comprising one or more complexes of the formula:

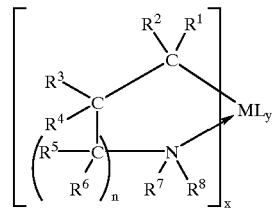

(Formula I)

wherein: M is a transition metal (also referred to as metals of Groups IB through VIIIB or 3–12); each R group is independently H, a hydrocarbyl group, a halogenated hydrocarbyl group, a halide, or a silylated hydrocarbyl group, with the proviso that $R^3$ and $R^4$ are not both H (preferably, neither is H); each L group is independently H, a hydrocarbyl group, a halogenated hydrocarbyl group, a silylated hydrocarbyl group, or a halide; x=1 to 3; n=0 to 4; y=0 to 4; and forming a metal-containing film from the precursor composition on a surface of the substrate (preferably, the semiconductor substrate or substrate assembly). The metal-containing film can be a single transition metal film or a transition metal alloy film. Using such methods, the complexes of Formula I are converted in some manner (e.g., decomposed thermally) and deposited on a surface to form a metal-containing film. Thus, the film is not simply a film of the complex of Formula I.

Complexes of Formula I are neutral complexes and may be liquids or solids at room temperature. If they are solids, they are preferably sufficiently soluble in an organic solvent or have melting points below their decomposition temperatures such that they can be used in flash vaporization, bubbling, microdroplet formation techniques, etc., or combinations thereof. However, they may also be sufficiently volatile that they can be vaporized or sublimed from the solid state using known chemical vapor deposition techniques. Thus, the precursor compositions of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material, preferably, however, there is a sufficient amount of the material that can be carried by the organic solvent into the vapor phase for chemical vapor deposition processing.

Yet another method of forming a metal-containing film on a substrate, such as a semiconductor substrate or substrate assembly during the manufacture of a semiconductor structure, involves: providing a substrate (preferably, a semiconductor substrate or substrate assembly); providing a precursor composition comprising one or more organic solvents and one or more precursor complexes of Formula I as defined above; vaporizing the precursor composition to form vaporized precursor composition; and directing the vaporized precursor composition toward the substrate to form a metal-containing film on a surface of the substrate. Herein, vaporized precursor composition includes vaporized molecules of precursor complexes of Formula I either alone or optionally with vaporized molecules of other compounds in the precursor composition, including solvent molecules, if used.

Preferred embodiments of the methods of the present invention involve the use of one or more chemical vapor deposition techniques, although this is not necessarily required. That is, for certain embodiments, sputtering, spin-on coating, etc., can be used.

Methods of the present invention are particularly well suited for forming films on a surface of a semiconductor substrate or substrate assembly, such as a silicon wafer, with or without layers or structures formed thereon, used in forming integrated circuits. It is to be understood that methods of the present invention are not limited to deposition on silicon wafers; rather, other types of wafers (e.g., gallium arsenide wafer, etc.) can be used as well. Also, methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A chemical vapor deposition system is also provided. The system includes a deposition chamber having a substrate positioned therein; a vessel containing a precursor composition comprising one or more complexes of Formula I as described above; and a source of an inert carrier gas for transferring the precursor composition to the chemical vapor deposition chamber.

The present invention further provides precursor compositions containing one or more complexes of Formula I wherein the compositions include at least two complexes containing different metals.

DETAILED DESCRIPTION OF THE PREFERRED EMBODIMENTS

Figure 1:
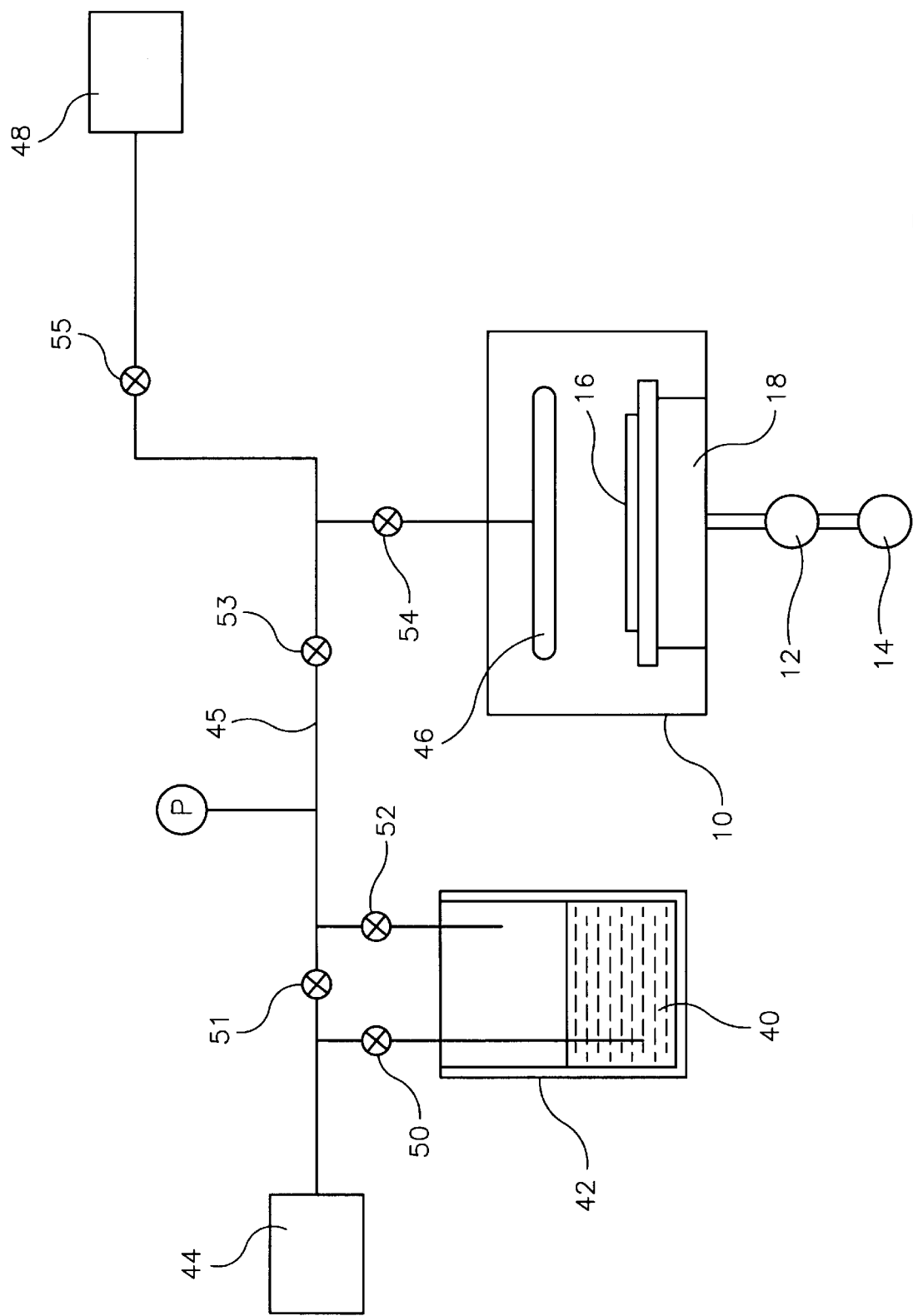
FIG. 1 is a schematic of a chemical vapor deposition system suitable for use in a method of the present invention.

The present invention provides a method of forming a metal-containing film using one or more transition metal complexes. These complexes are typically mononuclear (i.e., monomers in that they contain one metal per molecule), although they can be in the form of weakly bound dimers (i.e., dimers containing two monomers weakly bonded together through hydrogen or dative bonds). Herein, such monomers and weakly bound dimers are shown as mononuclear complexes.

The complexes of Formula I are neutral complexes and may be liquids or solids at room temperature. If they are solids, they are sufficiently soluble in an organic solvent to allow for vaporization, they can be vaporized or sublimed from the solid state, or they have melting temperatures below their decomposition temperatures. Thus, many of the complexes described herein are suitable for use in chemical vapor deposition (CVD) techniques, such as flash vaporization techniques, bubbler techniques, and/or microdroplet techniques. Preferred embodiments of the complexes described herein are particularly suitable for low temperature CVD, e.g., deposition techniques involving vaporization temperatures of about 50° C. to about 300° C.

The solvents that are suitable for this application can be one or more of the following: saturated or unsaturated linear, branched, or cyclic aliphatic (alicyclic) hydrocarbons ($C_3$–$C_{20}$ and preferably $C_5$–$C_{10}$), cyclic, branched, or linear), aromatic hydrocarbons ($C_5$–$C_{20}$, and preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitriles, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor compositions are sensitive to reactions with protic solvents, and examples of these noted above may not be ideal, depending on the nature of the precursor complexes. The complexes are also generally compatible with each other, so that mixtures of variable quantities of the complexes will not interact to significantly change their physical properties.

One preferred method of the present invention involves vaporizing a precursor composition that includes one or more transition metal complexes. Also, the precursor composition can include complexes containing other metals or metalloids. Furthermore, the precursor composition can include one or more organic solvents.

The precursor composition can be vaporized in the presence of an inert carrier gas to form a relatively pure metal or metal alloy film. The inert carrier gas is typically selected from the group consisting of nitrogen, helium, argon, and mixtures thereof. In the context of the present invention, an inert carrier gas is one that is generally unreactive with the complexes described herein and does not interfere with the formation of a metal-containing film. Whether done in the presence of a carrier gas or not, the vaporization is preferably done in the absence of oxygen to avoid oxygen contamination of the films.

Alternatively, however, the precursor composition can be vaporized in the presence of a reaction gas to form a film. The reaction gas can be selected from a wide variety of gases reactive with the complexes described herein, at least at a surface under the conditions of chemical vapor deposition. Examples of reaction gases include $SiH_4$, $Si_2H_6$, $NH_3$, $N_2H_4$, $PH_3$, $AsH_3$, $GeH_4$, t-$BuSbMe_2$, $H_2S$, $H_2Se$, $CO$, $CH_4$, and $Te(allyl)_2$. Various combinations of carrier gases and/or reaction gases can be used in the methods of the present invention to form metal-containing films. Thus, the metal-containing film can include a carbide, nitride, phosphide, arsenide, stibnide, sulfide, selenide, telluride, or combinations thereof, for example. Such films can also be formed by initially forming a generally pure metal or metal alloy film and subsequently subjecting it to a process such as silicidation. A film can be deposited in a wide variety of thicknesses, depending on the desired use.

The transition metal complexes described herein are three to six coordinate complexes having one to three multidentate ligands. The ligand typically has one carbon atom that covalently bonds to the metal and one nitrogen atom that forms a dative bond with the metal. The multidentate ligand stabilizes the metal complex by incorporating the nitrogen donor atom into the ligand (chelate effect). This eliminates the problem of dissociation of simple donor ligands prior to thermal decomposition.

The transition metal complex is of the following formula, which is shown as a monomer, although weakly bound dimers are also possible:

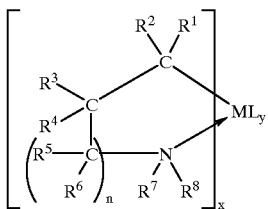

(Formula I)

wherein: M is a transition metal (i.e., a metal of Groups IB through VIIIB or 3–12, preferably, M is Co, Rh, Ir, Fe, Ru, Os, Ni, Pd, or Pt); each R group is independently H, a hydrocarbyl group, a halogenated hydrocarbyl group, a halide, or a silylated hydrocarbyl group, with the proviso that $R^3$ and $R^4$ are not both H (preferably, neither is H); each L group is independently H, a hydrocarbyl group, a halogenated hydrocarbyl group, a silylated hydrocarbyl group, or a halide; x=1 to 3 (preferably, 2 or 3); n=0 to 4 (preferably, 1 or 2); y=0 to 4 (preferably, 0); and forming a metal-containing film from the precursor composition on a surface of the substrate (preferably, the semiconductor substrate or substrate assembly).

The ligand $(C(R^1)(R^2))(C(R^3)(R^4))(C(R^5)(R^6))_nN(R^7)(R^8)$ is typically bound to the central metal through the $N(R^7)(R^8)$ unit and the $C(R^1)(R^2)$ unit. The R groups on the carbon and nitrogen atoms can be joined together to form a ring or rings, including aromatic and heterocyclic rings. Furthermore, any of the R groups can be replaced by multiple bonds between atoms in the ligand backbone. Thus, the core structure of Formula I is represented by:

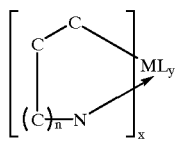

As used herein, the term "hydrocarbyl group" means an organic hydrocarbon group that is classified as an aliphatic group, cyclic group, or combination of aliphatic and cyclic groups (e.g., alkaryl and aralkyl groups). In the context of the present invention, the organic groups are those that do not interfere with the formation of a metal-containing film.

Preferably, they are of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon—carbon double bonds, such as a vinyl group. The term "alkynyl group" means an unsaturated, linear or branched hydrocarbon group with one or more carbon—carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "hydrocarbyl group" does not include substitution, however, the hydrocarbyl groups may be substituted with halogen or silicon atoms, thereby forming "halogenated hydrocarbyl groups" and "silylated hydrocarbyl groups," respectively.

The R groups can be joined to form a ring or rings, which may or may not have unsaturation, including aromaticity. They may also be replaced by multiple bonds between atoms in the core structure. Preferred R groups ($R^1$, $R^2$, $R^3$, $R^4$, $R^5$, $R^6$, $R^7$, and $R^8$) in the complexes of Formula I include H, $(C_1-C_{30})$hydrocarbyl groups, halogenated $(C_1-C_{30})$ hydrocarbyl groups, halides (F, Cl, Br, and I), and tri$(C_1-C_5)$ alkysilyl groups. More preferred R groups include H, $(C_1-C_{20})$hydrocarbyl groups, halogenated $(C_1-C_{20})$ hydrocarbyl groups, halides, and tri$(C_1-C_5C)$alkysilyl groups. Most preferred R groups include H, $(C_1-C_8)$ hydrocarbyl groups, halogenated $(C_1-C_8)$hydrocarbyl groups, halides, and tri$(C_1-C_5)$alkysilyl groups. Of the halides, F and Cl are preferred. The $R^3$ and $R^4$ groups are not both hydrogen, and preferably, neither is hydrogen, due to the instability of such complexes. Preferably, the $R^1$, $R^2$, $R^5$, $R^6$, $R^7$, and $R^8$ groups are independently H, hydrocarbyl groups (nonhalogenated), halogenated hydrocarbyl groups, and silylated hydrocarbyl groups, and the $R^3$ and $R^4$ groups are independently hydrocarbyl groups (nonhalogenated), halogenated hydrocarbyl groups, halides, and silylated hydrocarbyl groups. In particularly preferred embodiments, the $R^3$, $R^4$, $R^7$, and $R^8$ groups are methyl groups, the $R^5$ and $R^6$ groups are hydrogen, and the $R^1$ and $R^2$ groups are hydrogen or SiMe$_3$.

Preferred L groups in the complexes of Formula I include H, $(C_1-C_{30})$hydrocarbyl groups, halogenated$(C_1-C_{30})$ hydrocarbyl groups, silylated$(C_1-C_{30})$hydrocarbyl groups, and halides (F, Cl, Br, and I). More preferred L groups include H, $(C_1-C_{20})$hydrocarbyl groups, halogenated $(C_1-C_{20})$hydrocarbyl groups, silylated$(C_1-C_{20})$hydrocarbyl groups, and halides. Most preferred L groups include H, $(C_1-C_8)$hydrocarbyl groups, halogenated$(C_1-C_8)$ hydrocarbyl groups, silylated$(C_1-C_8)$hydrocarbyl groups, and halides. Of the halides for the L groups, F and Cl are preferred.

A preferred class of complexes of Formula I include complexes containing 2 or 3 of the chelating ligands and no L groups. This class of complexes of Formula I is particularly advantageous because they are most likely to be mononuclear and volatile.

The complexes of Formula I can take the following forms (which are representative only):

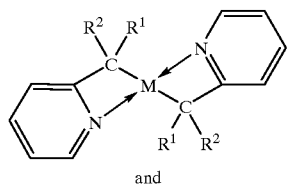

and

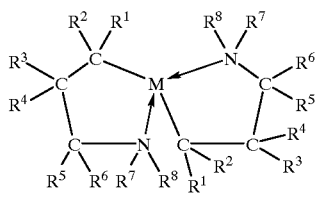

In the first of these two formulas, n=0, y=0, x=2, and $R^3$ and $R^4$ represent the same group as do $R^7$ and $R^8$, which are bonded together to form a ring.

As stated above, the complexes of Formula I are neutral complexes and may be liquids or solids at room temperature. If they are solids, they are preferably sufficiently soluble in an organic solvent to allow for vaporization by flash vaporization, bubbling, microdroplet formation, etc. However, these complexes can also be vaporized or sublimed from the solid state using known chemical vapor deposition techniques.

Various combinations of the complexes described herein can be used in a precursor composition. Thus, as used herein, a "precursor composition" refers to a liquid or solid that includes one or more complexes of the formulas described herein optionally mixed with one or more complexes of formulas other than those of Formula I. The precursor composition can also include one or more organic solvents suitable for use in a chemical vapor deposition system, as wekk as other additives, such as free ligands, that assist in the vaporization of the desired compounds.

The complexes described herein can be used in precursor compositions for chemical vapor deposition. Alternatively, certain complexes described herein can be used in other deposition techniques, such as sputtering, spin-on coating, and the like. Typically, those complexes containing R groups with a low number of carbon atoms (e.g., 1–4 carbon atoms per R group) are suitable for use with vapor deposition techniques. Those complexes containing R groups with a higher number of carbon atoms (e.g., 5–12 carbon atoms per R group) are generally suitable for spin-on or dip coating. Preferably, however, chemical vapor deposition techniques are desired because they are more suitable for deposition on semiconductor substrates or substrate assemblies, particularly in contact openings which are extremely small and require conformally filled layers of metal.

For the preparation of alloy films, two or more complexes of Formula I can be combined in a precursor composition (e.g., Co(CH$_2$CMe$_2$CH$_2$NMe$_2$)$_2$ wherein the nitrogen atom is also bonded to the cobalt, and RhCl(CH$_2$CMe$_2$CH$_2$NMe$_2$)$_2$ wherein the nitrogen atom is also bonded to the rhodium for a Co/Rh alloy). Alternatively, at least one complex of Formula I can be combined with another complex in a precursor composition (e.g., Co(CH$_2$CMe$_2$CH$_2$NMe$_2$)$_2$ wherein the nitrogen atom is also bonded to the cobalt, and Ir(allyl)$_3$ for a Co/Ir alloy).

The complexes used in the present invention can be prepared by a variety of methods known to one of skill in the art. For example, Co{C(SiMe$_3$)$_2$(C$_5$H$_4$N)}$_2$ wherein the nitrogen atom is also bonded to the cobalt, can be prepared by the method outlined in Leung et al., *J.C.S. Dalton*, 779 (1997).

Methods of the present invention can be used to deposit a metal-containing film, preferably a metal or metal alloy film, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The film is deposited upon decomposition (typically, thermal decomposition) of a complex of Formula I, preferably one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

A typical chemical vapor deposition (CVD) system that can be used to perform the process of the present invention is shown in FIG. 1. The system includes an enclosed chemical vapor deposition chamber 10, which may be a cold wall-type CVD reactor. As is conventional, the CVD process may be carried out at pressures of from atmospheric pressure down to about 10$^{-3}$ torr, and preferably from about 10 torr to about 0.1 torr. A vacuum may be created in chamber 10 using turbo pump 12 and backing pump 14.

One or more substrates 16 (e.g., semiconductor substrates or substrate assemblies) are positioned in chamber 10. A constant nominal temperature is established for the substrate, preferably at a temperature of about 100° C. to about 600° C., and more preferably at a temperature of about 100° C. to about 300° C. Substrate 16 may be heated, for example, by an electrical resistance heater 18 on which substrate 16 is mounted. Other known methods of heating the substrate may also be utilized.

In this process, the precursor composition 40, which contains one or more complexes of Formula I (and/or other metal or metalloid complexes), is stored in liquid form (a neat liquid at room temperature or at an elevated temperature if solid at room temperature) in vessel 42. A source 44 of a suitable inert gas is pumped into vessel 42 and bubbled through the neat liquid (i.e., without solvent) picking up the precursor composition and carrying it into chamber 10 through line 45 and gas distributor 46. Additional inert carrier gas or reaction gas may be supplied from source 48 as needed to provide the desired concentration of precursor composition and regulate the uniformity of the deposition across the surface of substrate 16. As shown, a series of valves 50–55 are opened and closed as required.

Generally, the precursor composition is pumped into the CVD chamber 10 at a flow rate of about 1 sccm (standard cubic centimeters) to about 1000 sccm. The semiconductor substrate is exposed to the precursor composition at a pressure of about 0.001 torr to about 100 torr for a time of about 0.01 minute to about 100 minutes. In chamber 10, the precursor composition will form an adsorbed layer on the surface of the substrate 16. As the deposition rate is temperature dependent, increasing the temperature of the substrate will increase the rate of deposition. Typical deposition rates are about 10 Angstroms/minute to about 1000 Angstroms/minute. The carrier gas containing the precursor composition is terminated by closing valve 53.

Figure 2:
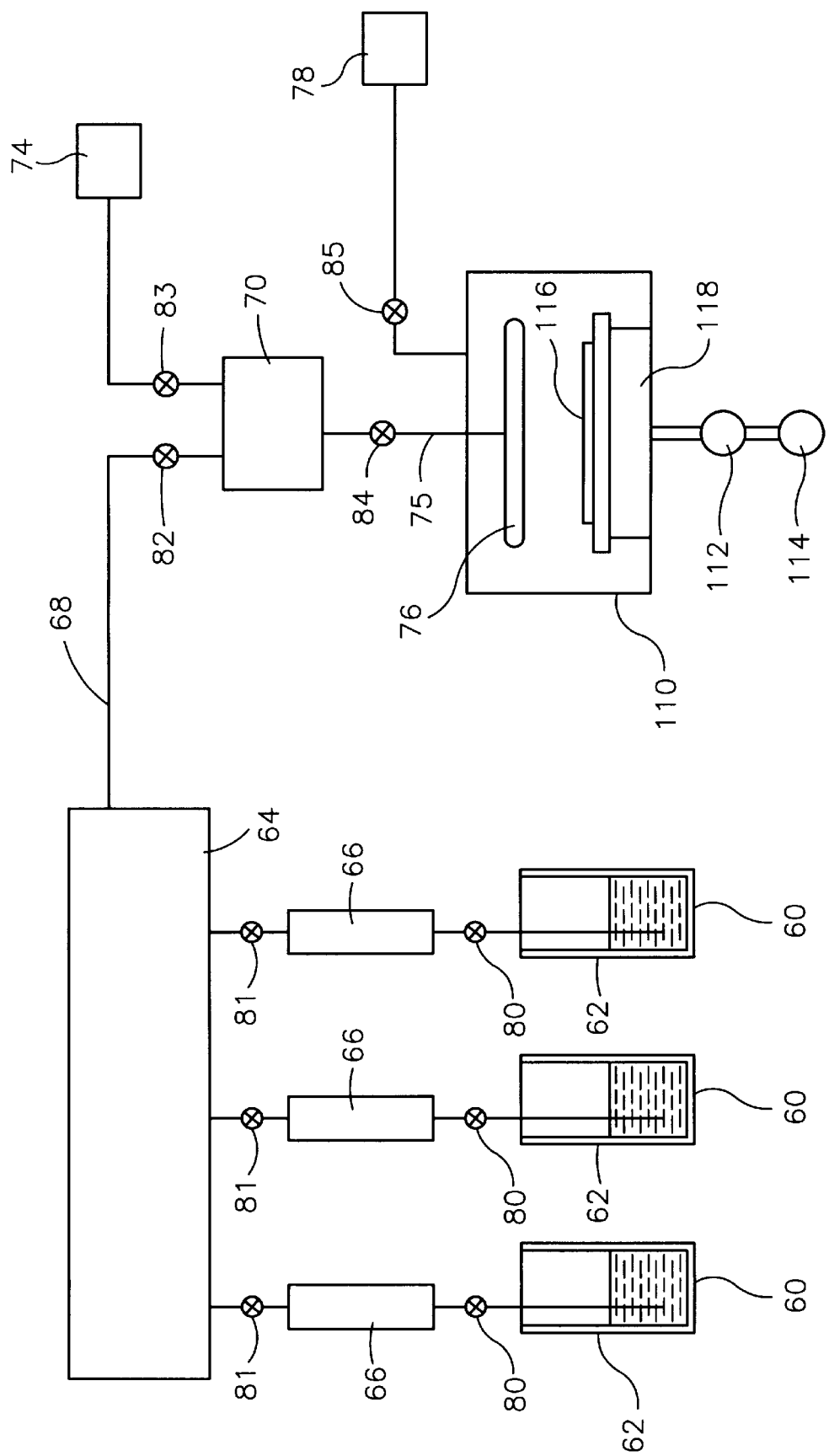
FIG. 2 is a schematic of an alternative chemical vapor deposition system suitable for use in a method of the present invention.

An alternative CVD system that can be used to perform the process of the present invention is shown in FIG. 2. The system includes an enclosed chemical vapor deposition chamber 110, which may be a cold wall-type CVD reactor, in which a vacuum may be created using turbo pump 112 and backing pump 114. One or more substrates 116 (e.g., semiconductor substrates or substrate assemblies) are positioned in chamber 110. Substrate 116 may be heated as described with reference to FIG. 1 (for example, by an electrical resistance heater 118).

In this process, one or more solutions 60 of one or more precursor complexes of Formula I (and/or other metal or metalloid complexes), are stored in vessels 62. The solutions are transferred to a mixing manifold 64 using pumps 66. The resultant precursor composition containing one or more precursor complexes and one or more organic solvents is then transferred along line 68 to vaporizer 70, to volatilize the precursor composition. A source 74 of a suitable inert gas is pumped into vaporizer 70 for carrying volatilized precursor composition into chamber 110 through line 75 and gas distributor 76. Reaction gas may be supplied from source 78 as needed. As shown, a series of valves 80–85 are opened and closed as required. Similar pressures and temperatures to those described with reference to FIG. 1 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition. Although specific vapor deposition processes are described by reference to FIGS. 1–2, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

As stated above, the use of the complexes of Formula I and methods of forming metal-containing films of the present invention are beneficial for a wide variety of thin film applications in semiconductor structures, particularly various metallization layers. Such applications include multilevel interconnects in an integrated circuit structure. Typically, thin films of Group VIII metals, such as cobalt, and alloys thereof are deposited as polycrystalline materials, usually in a range of about 20 Angstroms to about 500 Angstroms thick.

Figure 3:
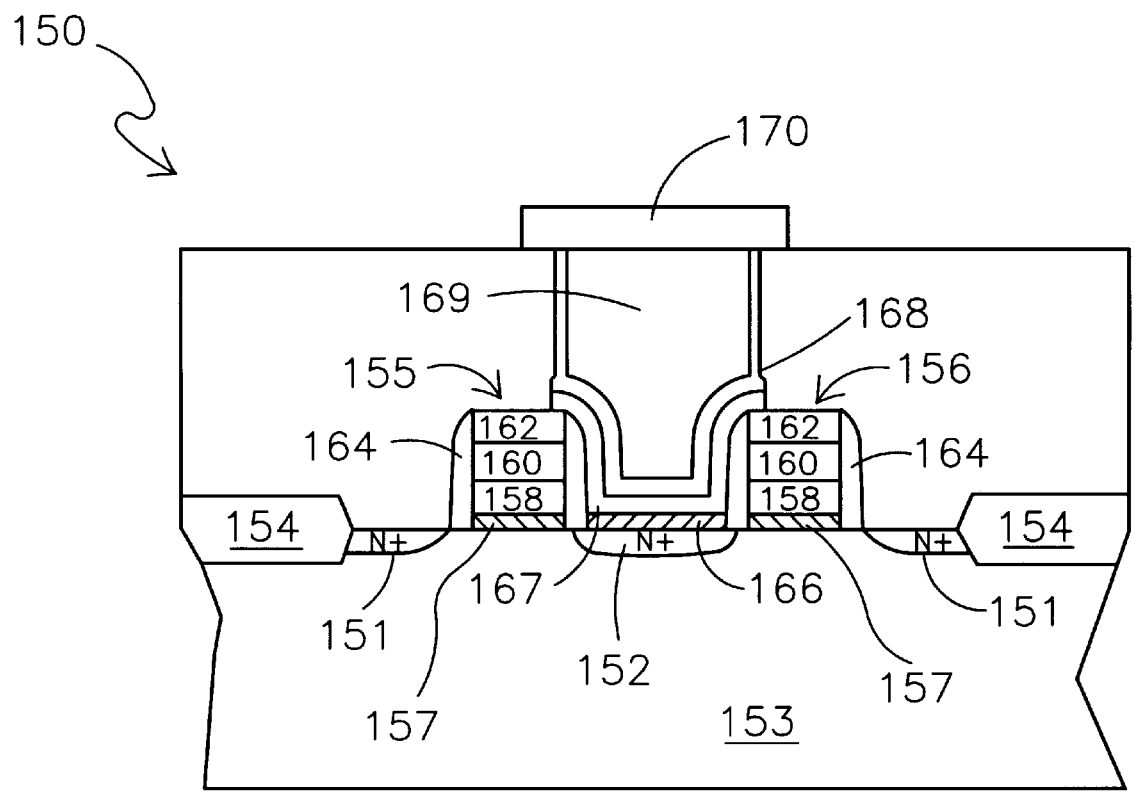
FIG. 3 is a schematic of a gate structure with a metal-containing film deposited in accordance with the method of the present invention.

As shown in FIG. 3, device structure 150 includes n-type active areas 151 and 152, p-well 153 having field oxide regions 154 deposited thereon in accordance with conventional techniques, and stacks 155 and 156, i.e., word lines. The stacks 155 and 156 may include, for example, a gate oxide region 157, a polysilicon region 158, a metal silicide region 160 (such as, for example, cobalt silicide formed in accordance with the present invention), and an oxide region 162 (such as TEOS). Further, the stacks 155 and 156 include spacers 164 at the side walls thereof. The structure may also include a cobalt silicide region 166 over the active n-type region 152, other interconnect layers 167, 168, and 169 such as titanium nitride, tungsten or any other interconnect material typically deposited for interconnect functions. Thereafter, other metallization layers 170, such as aluminum or any other metal conventionally used may be deposited for connection to the bit line contact as is known to one skilled in the art.

The following examples are offered to further illustrate the various specific and preferred embodiments and techniques. It should be understood, however, that many variations and modifications may be made while remaining within the scope of the present invention.

EXAMPLE

A 0.1 molar solution of $Co\{C(SiMe_3)_2(C_5H_4N)\}_2$ in THF (5.32 g in 100 mL) is delivered to a vaporizer (COVA Technologies, Inc., Colorado Spring, Colo.) using a syringe pump. From here the vaporized precursor composition (vaporizer temperature=180° C.) is transferred via helium carrier gas (50 sccm) to the CVD reactor containing the substrate. A cobalt film is deposited on silicon substrate that is heated to 550° C. Hydrogen is used as a reactant gas (100 sccm) and the pressure inside the chamber is 1 Torr. Thicknesses of cobalt on the silicon substrate are determined by the deposition time and the substrate temperature.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of manufacturing a semiconductor structure, the method comprising:

provided a semiconductor substrate or substrate assembly;

providing a precursor composition comprising one or more complexes having a structure of the formula:

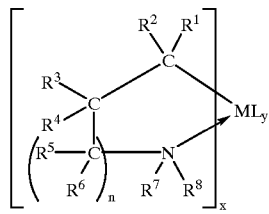

wherein:
  M is a transition metal selected from the group consisting of IB, IIB, IIIB, IVB, VB, VIB, VIIB, and VIIIB metals;
  each R group is independently H, a hydrocarbyl group, a halogenated hydrocarbyl group, a halide, or a silylated hydrocarbyl group, with the proviso that $R^3$ and $R^4$ are both methyl and optionally the R groups are replaced by multiple bonds between backbone atoms in the structure;
  each L group is independently H, a hydrocarbyl group, a halogenated hydrocarbyl group, a silylated hydrocarbyl group, or a halide;
  x=1 to 3;
  n=0 to 4;
  y=0 to 4; and
forming a metal-containing film from the precursor composition on a surface of the semiconductor substrate or substrate assembly.

2. The method of claim 1 wherein the step of forming a metal-containing film comprises vaporizing the precursor composition and directing it toward the semiconductor substrate or substrate assembly using a vaporization technique.

3. The method of claim 2 wherein the vaporization technique comprises flash vaporization, bubbling, microdroplet formation, or combinations thereof.

4. The method of claim 1 wherein the semiconductor substrate is a silicon wafer.

5. The method of claim 1 wherein M is selected from the group consisting of Co, Rh, Ir, Fe, Ru, Os, Ni, Pd, and Pt.

6. The method of claim 1 wherein each $R^1$, $R^2$, $R^5$, and $R^6$ is hydrogen and each $R^7$ and $R^8$ is a methyl group.

7. The method of claim 1 wherein each $R^1$ and $R^2$ is $SiMe_3$, each $R^5$ and $R^6$ is hydrogen, and each $R^7$ and $R^8$ is a methyl group.

8. The method of claim 1 wherein the precursor composition is a liquid.

9. The method of claim 1 wherein the precursor composition is vaporized in the presence of a reaction gas, an inert carrier gas, or a combination thereof.

10. The method of claim 9 wherein the reaction gas is $SiH_4$, $Si_2H_6$, $NH_3$, $N_2H_4$, $PH_3$, $AsH_3$, $GeH_4$, t-$BuSbMe_2$, $H_2S$, $H_2SE$, CO, $CH_4$, or $Te(allyl)_2$.

11. The method of claim 1 wherein the metal containing film is a single transition metal or a transition metal alloy film.

12. A method of manufacturing a semiconductor structure, the method comprising:
  providing a semiconductor substrate or substrate assembly;
  providing a precursor composition comprising one or more organic solvents and one or more complexes having a structure of the formula:

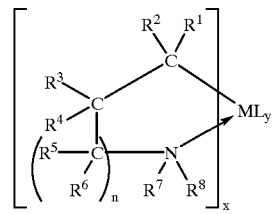

wherein:
  M is a transition metal selected from the group consisting of IB, IIB, IIIB, IVB, VB, VIB, VIIB, and VIIIB metals;
  each R group is independently H, a hydrocarbyl group, a halogenated hydrocarbyl group, a halide, or a silylated hydrocarbyl group, with the proviso that $R^3$ and $R^4$ are both methyl and optionally the R groups are replaced by multiple bonds between backbone atoms in the structure;
  each L group is independently H, a hydrocarbyl group, a halogenated hydrocarbyl group, a silylated hydrocarbyl group, or a halide;
  x=1 to 3;
  n=0 to 4;
  y=0 to 4; and
vaporizing the precursor composition to form vaporized precursor composition; and
directing the vaporized precursor composition toward the semiconductor substrate or substrate assembly to form a metal-containing film on a surface of the semiconductor substrate or substrate assembly.

13. The method of claim 12 wherein each $R^1$, $R^2$, $R^5$, and $R^6$ is hydrogen and each $R^7$ and $R^8$ is a methyl group.

14. The method of claim 12 wherein each $R^1$ and $R^2$ is $SiMe_3$, each $R^5$ and $R^6$ is hydrogen, and each $R^7$ and $R^8$ is a methyl group.

15. A method of forming a film on a substrate, the method comprising:
  providing a substrate;
  providing a precursor composition comprising one or more complexes having a structure of the formula:

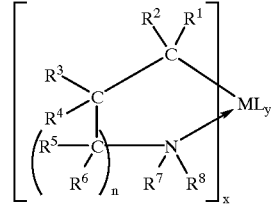

wherein:
  M is a transition metal selected from the group consisting of IB, IIB, IIIB, IVB, VB, VIB, VIIB, and VIIIB metals;
  each R group is independently H, a hydrocarbyl group, a halogenated hydrocarbyl group, a halide, or a silylated hydrocarbyl group, with the proviso that $R^3$ and $R^4$ are both methyl and optionally the R groups are replaced by multiple bonds between backbone atoms in the structure;
  each L group is independently H, a hydrocarbyl group, a halogenated hydrocarbyl group, a silylated hydrocarbyl group, or a halide;

x=1 to 3;
n=0 to 4;
y=0 to 4; and forming a metal-containing film from the precursor composition on a surface of the substrate.

16. The method of claim 15 wherein the step of forming a metal-containing film comprises vaporizing the precursor composition and directing it toward the substrate using a chemical vapor deposition technique.

17. The method of claim 16 wherein the precursor composition is a liquid.

18. The method of claim 15 wherein each $R^1$, $R^2$, $R^5$, and $R^6$ is hydrogen and each $R^7$ and $R^8$ is a methyl group.

19. The method of claim 15 wherein each $R^1$ and $R^2$ is $SiMe_3$, each $R^5$ and $R^6$ is hydrogen, and each $R^7$ and $R^8$ is a methyl group.

20. A method of forming a film on a substrate, the method comprising:

providing a substrate;

providing a precursor composition comprising one or more organic solvents and one or more complexes having a structure of the formula:

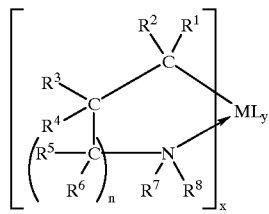

wherein:
M is a transition metal selected from the group consisting of IB, IIB, IIIB, IVB, VB, VIB, VIIB, and VIIIB metals;
each R group is independently H, a hydrocarbyl group, a halogenated hydrocarbyl group, a halide, or a silylated hydrocarbyl group, with the proviso that $R^3$ and $R^4$ are both methyl and optionally the R groups are replaced by multiple bonds between backbone atoms in the structure;
each L group is independently H, a hydrocarbyl group, a halogenated hydrocarbyl group, a silylated hydrocarbyl group, or a halide;
x=1 to 3;
n=0 to 4;
y=0 to 4; and
vaporizing the precursor composition to form vaporized precursor composition; and
directing the vaporized precursor composition toward the substrate to form a metal-containing film on a surface of the substrate.

21. The method of claim 20 wherein each $R^1$, $R^2$, $R^5$, and $R^6$ is hydrogen and each $R^7$ and $R^8$ is a methyl group.

22. The method of claim 20 wherein each $R^1$ and $R^2$ is $SiMe_3$, each $R^5$ and $R^6$ is hydrogen, and each $R^7$ and $R^8$ is a methyl group.

23. A method of manufacturing a semiconductor structure, the method comprising:

providing a semiconductor substrate or substrate assembly;

providing a precursor composition comprising one or more complexes having a structure of the formula:

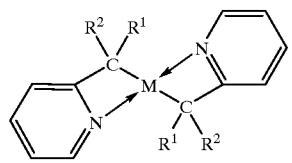

wherein:
M is a transition metal selected from the group consisting of IB, IIB, IIIB, IVB, VB, VIB, VIIB, and VIIIB metals;
each $R^1$ and $R^2$ group is independently H, a hydrocarbyl group, a halogenated hydrocarbyl group, a halide, or a silylated hydrocarbyl group; and
forming a metal-containing film from the precursor composition on a surface of the semiconductor substrate or substrate assembly.

24. A method of manufacturing a semiconductor structure, the method comprising:

providing a semiconductor substrate or substrate assembly;

providing a precursor composition comprising one or more organic solvents and one or more complexes having a structure of the formula:

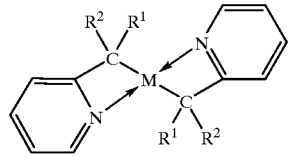

wherein:
M is a transition metal selected from the group consisting of IB, IIB, IIIB, IVB, VB, VIB, VIIB, and VIIIB metals;
each $R^1$ and $R^2$ group is independently H, a hydrocarbyl group, a halogenated hydrocarbyl group, a halide, or a silylated hydrocarbyl group; and
vaporizing the precursor composition to form vaporized precursor composition; and
directing the vaporized precursor composition toward the semiconductor substrate or substrate assembly to form a metal-containing film on a surface of the semiconductor substrate or substrate assembly.

25. A method of forming a film on a substrate, the method comprising:

providing a substrate;

providing a precursor composition comprising one or more complexes having a structure of the formula:

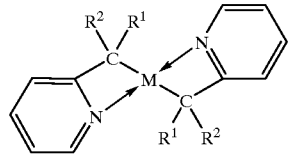

wherein:
M is a transition metal selected from the group consisting of IB, IIB, IIIB, IVB, VB, VIB, VIIB, and VIIIB metals;
each $R^1$ and $R^2$ group is independently H, a hydrocarbyl group, a halogenated hydrocarbyl group, a halide, or a silylated hydrocarbyl group; and forming a metal-containing film from the precursor composition on a surface of the substrate.

26. A method of forming a film on a substrate, the method comprising:

providing a substrate;

providing a precursor composition comprising one or more organic solvents and one or more complexes having a structure of the formula:

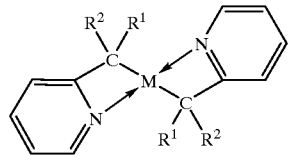

wherein:

M is a transition metal selected from the group consisting of IB, IIB, IIIB, IVB, VB, VIB, VIIB, and VIIIB metals;

each $R^1$ and $R^2$ group is independently H, a hydrocarbyl group, a halogenated hydrocarbyl group, a halide, or a silylated hydrocarbyl group; and vaporizing the precursor composition to form vaporized precursor composition; and directing the vaporized precursor composition toward the substrate to form a metal-containing film on a surface of the substrate.

* * * * *

UNITED STATES PATENT AND TRADEMARK OFFICE
CERTIFICATE OF CORRECTION

PATENT NO.    : 6,214,729 B1
DATED         : April 10, 2001
INVENTOR(S)   : Stefan Uhlenbrock et al.

It is certified that error appears in the above-identified patent and that said Letters Patent is hereby corrected as shown below:

<u>Title page,</u>
Item [56], U.S. PATENT DOCUMENTS,
Second entry delete "7/1991" and insert -- 6/1991 -- therefor.
Second entry delete "(DE)" and insert -- (DD) -- therefor.
Item [56], FOREIGN PATENT DOCUMENTS, fourth entry delete "43 13 292 A1" and insert -- 42 13 292 A1 -- therefor.
Item [56], OTHER PUBLICATIONS, third reference delete "alklys" and insert -- alkyls -- therefor.

<u>Column 4,</u>
Lines 24-25, delete "cyclic, branched, or linear)".

<u>Column 6,</u>
Line 34, delete the "C" following "$C_5$".

<u>Column 7,</u>
Line 41, delete "wekk" and insert -- well -- therefor.

<u>Column 11,</u>
Line 56, delete "$H_2SE$" and insert -- $H_2Se$ -- therefor.

Signed and Sealed this

Twenty-first Day of January, 2003

JAMES E. ROGAN
*Director of the United States Patent and Trademark Office*